US007693290B2

(12) United States Patent
Mizuno

(10) Patent No.: US 7,693,290 B2

(45) Date of Patent: Apr. 6, 2010

(54) SOUND REPRODUCTION DEVICE

(75) Inventor: Tomoaki Mizuno, Kariya (JP)

(73) Assignee: DENSO CORPORATION, Kariya (JP)

( * ) Notice: Subject to any disclaimer, the term of this patent is extended or adjusted under 35 U.S.C. 154(b) by 1288 days.

(21) Appl. No.: 11/188,879

(22) Filed: Jul. 26, 2005

(65) Prior Publication Data

US 2006/0034464 A1 Feb. 16, 2006

(30) Foreign Application Priority Data

Aug. 16, 2004 (JP) ............................. 2004-236540

(51) Int. Cl.
*H03G 3/00* (2006.01)

(52) U.S. Cl. .............. 381/61; 381/2; 381/3; 455/226.1; 455/226.2; 455/567; 455/234.1

(58) Field of Classification Search ................... 381/61, 381/63, 2–3, 104, 107; 455/234.1, 143, 246.1, 455/569.1, 550.1, 575.1, 566, 567, 456, 226.1–226.2
See application file for complete search history.

(56) References Cited

U.S. PATENT DOCUMENTS

| | | | | |
|---|---|---|---|---|
| 5,028,883 | A | 7/1991 | Itoh et al. | |
| 5,241,604 | A | 8/1993 | Noguchi | |
| 5,327,457 | A | 7/1994 | Leopold | |
| 7,151,954 | B2 * | 12/2006 | Nagata | 455/567 |
| 2002/0119760 | A1 * | 8/2002 | Oyagi | 455/130 |
| 2003/0220123 | A1 * | 11/2003 | Motohashi | 455/550.1 |
| 2004/0016338 | A1 * | 1/2004 | Dobies | 84/662 |

FOREIGN PATENT DOCUMENTS

| | | |
|---|---|---|
| JP | A-3-192129 | 8/1991 |
| JP | B2-2787601 | 8/1991 |
| JP | A-04-030700 | 2/1992 |
| JP | A-07-038356 | 2/1995 |
| JP | A-8-139663 | 5/1996 |
| JP | A-10-154944 | 6/1998 |
| JP | A-11-122197 | 4/1999 |
| JP | A-2000-101460 | 4/2000 |
| JP | A-2001-326708 | 11/2001 |
| JP | A-2002-359665 | 12/2002 |

OTHER PUBLICATIONS

Office Action mailed Oct. 7, 2008 in corresponding Japanese patent application No. 2004-236540 (and English translation).

* cited by examiner

*Primary Examiner*—Xu Mei
*Assistant Examiner*—Disler Paul
(74) *Attorney, Agent, or Firm*—Posz Law Group, PLC

(57) ABSTRACT

A sound reproduction device such as a radio receiver or a cellular phone includes an antenna, a control unit and a speaker. The control unit determines whether a radio wave receiving condition is satisfactory. The receiving condition is represented by field strength of the radio wave or a degradation of a sound signal in the radio wave. If the receiving condition is not satisfactory, the control unit adds an acoustic effect to the sound signal thereby to notify listeners of degradation of receiving condition. The acoustic effect may be a changing of sound image localization, a changing of a frequency characteristic and a changing of a reverberation characteristic. The acoustic effect is stopped for a specified period after the acoustic effect is added, even when the receiving condition is not satisfactory.

18 Claims, 2 Drawing Sheets

SOUND REPRODUCTION DEVICE

CROSS REFERENCE TO RELATED APPLICATION

This application is based on and incorporates herein by reference Japanese patent application No. 2004-236540 filed on Aug. 16, 2004.

FIELD OF THE INVENTION

The present invention relates to a sound reproduction device, which receives sound signals transmitted via radio communication and reproduces sounds based on the received sound signals. The present invention particularly relates to a sound reproduction device, which can notify listeners of degradation of received sound signals.

BACKGROUND OF THE INVENTION

In a conventional sound reproduction device, which receives sound signals transmitted via analog radio communication, noise level increases in the reproduced sounds as radio wave propagation condition worsens. Listeners therefore may recognize degree of degradation of the radio wave propagation condition. The recent digital communication technology, software demodulation technology, etc. improves quality of reproduced sounds. As a result, sounds are reproduced without noises if the radio wave propagation path is in a condition acceptable to reproduce sounds. Sounds sometimes break up if the radio wave propagation path is not in the acceptable condition. In the case that the sound reproduction device is a mobile type like a cellular phone, the radio wave propagation condition is likely to worsen if the device is moved into a weak electric field area. Therefore, it is desired to notify users of degrading propagation condition so that quality of the sound reproduction is not degraded.

In cellular phones, as disclosed in JP-A-3-192129, alarm sounds are added to the sounds when the radio wave propagation condition degrades in the middle of communication. Alternatively, as disclosed in JP-A-8-139663 and JP-A-11-122197, pseudo noises varying with the level of degradation of the propagation condition are added to the sounds.

In sound reproduction devices like a radio receivers that reproduce voice sounds or music sounds, the alarm sounds or pseudo noises will lower the reproducibility of sounds and artistic quality of music.

SUMMARY OF THE INVENTION

It is therefore an object of the present invention to provide a sound reproduction device that can notify listeners of degradation of a radio wave propagation condition without degrading quality of reproduced sounds.

According to the present invention, a sound reproduction device receives a radio wave including a sound signal and reproduces a sound corresponding to the sound signal. The device determines whether a radio wave receiving condition corresponding to field strength of the radio wave or a radio wave propagation condition is satisfactory or acceptable. The device adds an acoustic effect to the sound signal so that the reproduced sound has the acoustic effect, when the receiving condition is not satisfactory. The acoustic effect allows all audible sound information included in the sound signal to be reproduced without being cancelled and does not add additional sounds that may disturb listeners. Therefore, the acoustic effect may make listeners to feel that only a source of sound changes between left and right or between front and rear.

BRIEF DESCRIPTION OF THE PREFERRED EMBODIMENT

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

Figure 1:
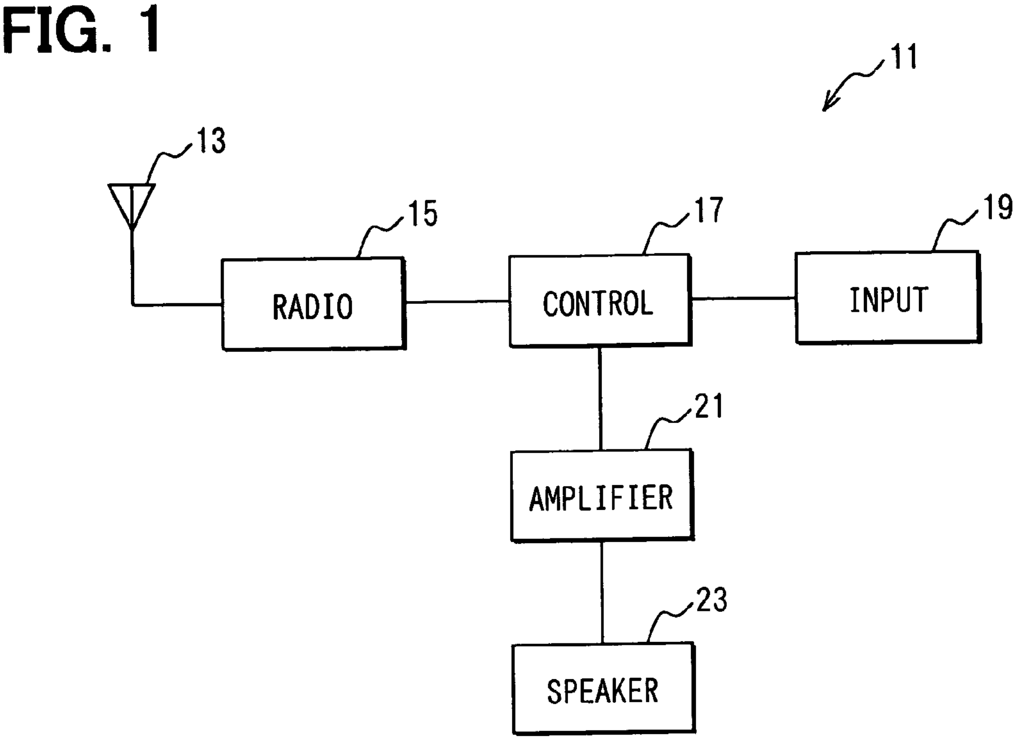
FIG. 1 is a block diagram showing a sound reproduction device according to an embodiment of the present invention.

Referring first to FIG. 1, a radio receiver 11 is constructed as a sound reproduction device. The radio receiver 11 is a digital type and includes an antenna 13, a radio unit 15, a control unit 17, an input unit 19, an amplifier 21 and a speaker 23.

The antenna 13 receives radio waves of digital radio broadcasts and converts received each radio wave to a corresponding electric signal. The radio unit 15 receives the electric signal from the antenna 13, extracts a signal of a specified frequency from the received signal, decodes the extracted signal and generate digital sound data including sound information.

Figure 3:
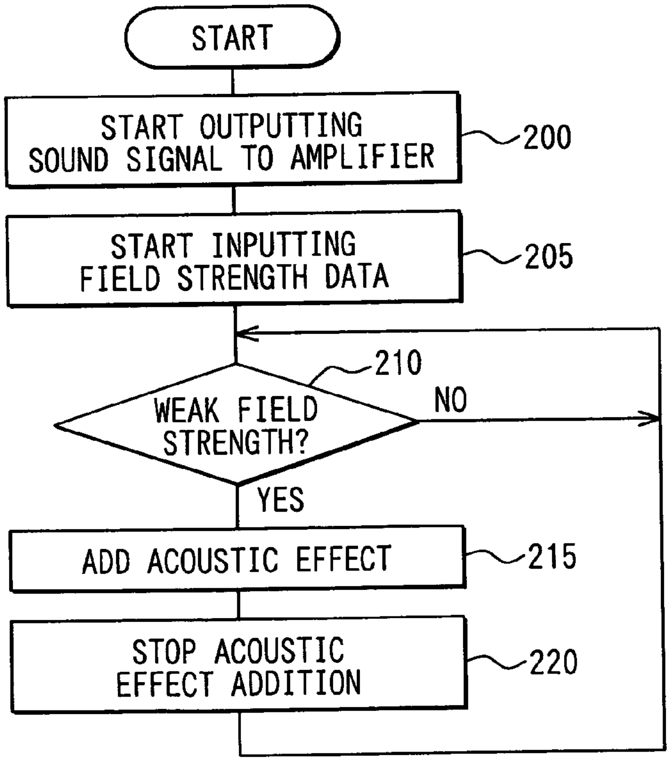
FIG. 3 is a flow chart showing acoustic effect addition processing in the second embodiment.

The control unit 17 receives the sound data, corrects errors in the sound data, and converting it to a corresponding analog sound signal after performing acoustic effect (sound effect) addition processing shown in FIG. 3. The control unit 17 also detects level of degradation of sound data based on the number of times of error corrections, the number of uncorrectable errors or the like.

The amplifier 21 receives the analog sound signal from the control unit 17 and outputs it to the speaker 23. The speaker 23 reproduces an audible sound in response to the received sound signal. The speaker 23 may be two to provide stereo sounds.

The input unit 19 includes mechanical switches and the like, which may be operated by a user to input various instructions such as selected broadcast stations and selected acoustic effect types.

Figure 2:
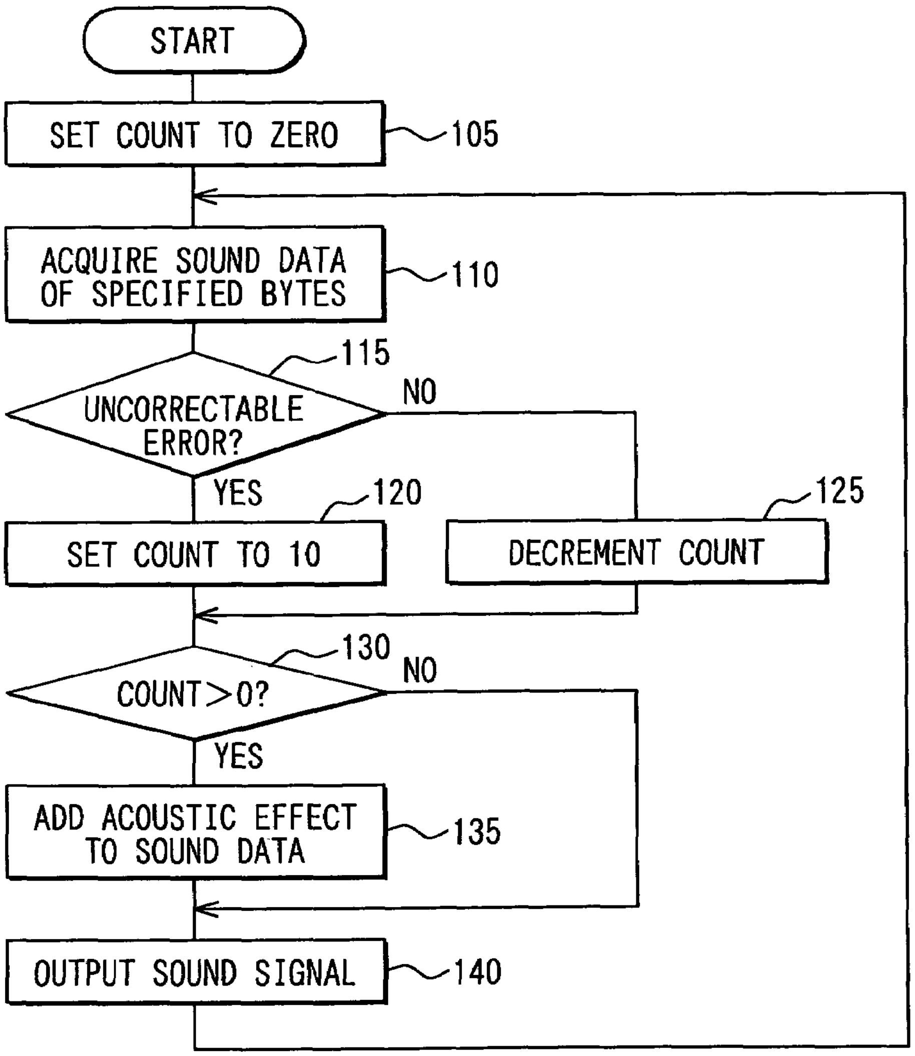
FIG. 2 is a flow chart showing sound reproduction processing in the first embodiment.

The control unit 17 is programmed to perform various processing including sound reproduction processing shown in FIG. 2. The control unit 17 starts performing these processing when a power is supplied by operating the input unit 19.

Specifically, as shown in FIG. 2, the control unit 17 first sets a count of a counter (not shown) to zero at step 105. The control unit 17 then acquires a specified bytes of the sound data from the radio unit 15 at step 110. The specified bytes may be determined to correspond to sounds of 0.5 seconds, for instance.

The control unit 17 corrects errors in the acquired sound data if any, and checks whether the sound data includes uncorrectable errors at step 115. The processing proceeds to step 120, if any uncorrectable error is included. The processing proceeds to step 125, if no such error is included. In step 120, the control unit 17 sets the count of the counter to 10. In step 125, the control unit 17 decrement the present count of the counter by 1. Thus, the counter takes at least 5 seconds (0.5 sec.×10 counts) to count down from 10 to 0 once the count has been set to 10 at step 120.

Following step 120 or 130, the control unit 17 checks whether the count is larger than 0. The processing proceeds to step 130, if the count is larger than 0. The processing proceeds to step 140, if the count is not larger than 0.

The control unit 17 executes addition of acoustic effect to the acquired sound data at step 135. The acoustic effect may include changing the sound image localization so that a source of sound changes left and right repeatedly from the side of listeners for instance. It may include changing a frequency characteristic so that bass sound is decreased and treble sound is increased for instance. It may also be changing a reverberation and reflection characteristic so that sound reverberation is provided like in a music hall for instance.

Preferably, the type, strength or the like of the acoustic effect is changeable with the extent of errors in the sound data, the count of the counter or the like. Listeners will recognize extent of degradation of the radio wave propagation condition from difference among acoustic effects.

The control unit 17 converts, at step 140, the sound data to a corresponding analog sound signal and outputs it to the amplifier 21, which in turn drives the speaker 23 to reproduce sounds. The control unit 17 repeats the above processing from step 110 after step 140.

According to the radio receiver 11 in the first embodiment, the radio wave propagation condition degradation is notified to listeners by addition of the acoustic effect to the reproduced sound without interrupting voice sounds by a pseudo noise (alarm sound for instance) or spoiling artistic character of music. The listeners thus notified of such degradation may enjoy sounds in high quality, without being irritated, by extending an antenna, changing the direction of an antenna or moving the radio receiver 11 to better radio reception positions. The acoustic effect is continuously provided for 5 seconds when the radio wave propagation condition degradation occurs, so that listeners will not miss the degradation. The addition of the acoustic effect may be cancelled for a certain period, 30 seconds for instance, after the addition of the same even when the uncorrectable errors continue to occur so that the addition of the acoustic effect does not bother listeners too much.

Second Embodiment

In the second embodiment, the radio receiver 11 is constructed as an analog radio receiver. Further, the radio unit 15 not only demodulates the received analog signal to produce the sound signal but also measure the electric field strength of the radio wave received by the antenna 13. The measured field strength data is provided to the control unit 17.

The control unit 17 is programmed to perform various processing including acoustic effect addition processing shown in FIG. 3. The control unit 17 starts performing these processing when a power is supplied by operating the input unit 19.

Specifically, as shown in FIG. 3, the control unit 17 starts outputting the sound signal received from the radio unit 15 to the amplifier 21 at step 200. The control unit 17 then starts inputting the field strength data from the radio unit 15 at step 205.

The control unit 17 checks at step 210 whether the field strength is weak, that is, the input field strength data is smaller than a specified value. If the field strength is not weak, the control unit 17 repeats step 210. If it is weak, the control unit 17 adds the acoustic effect to the sound signal applied to the amplifier 21 for a specified period, 5 seconds for instance. This acoustic effect may be the same as in the first embodiment, and changeable with the field strength. After the acoustic effect addition for the specified period, the control unit 17 stops the addition of acoustic effect for another specified period, 3 seconds for instance, even when the field strength continues to be weak.

The second embodiment also provides the same or similar advantages as the first embodiment.

The above embodiments may be modified in various ways. For instance, the addition of the acoustic effect may be applied to cellular phones, televisions and the like.

What is claimed is:

1. A sound reproduction device comprising:

receiving means for receiving a radio wave including a sound signal;

reproducing means for reproducing a sound corresponding to the sound signal;

determining means for determining whether a field strength of the radio wave is less than a specified level;

adding means for adding an acoustic effect to the sound signal so that the sound reproduced by the reproducing means has the acoustic effect, when the field strength is less than the specified level, and stopping means for stopping the acoustic effect for a specified period after the acoustic effect is added to the sound signal, even when the field strength is less than the specified level, wherein the stopping means automatically cancels the stopping of the acoustic effect after elapse of the specified period, when the field strength continues to be less than the specified level after the specified period.

2. The sound reproduction device as in claim 1, wherein the acoustic effect allows all audible sound information included in the sound signal to be reproduced by the reproducing means.

3. The sound reproduction device as in claim 1, wherein the adding means changes a characteristic of the acoustic effect based on a level of the field strength.

4. The sound reproduction device as in claim 3, wherein the characteristic of the acoustic effect includes at least one of type, strength and duration of the acoustic effect.

5. The sound reproduction device as in claim 1, wherein the adding means continues to add the acoustic effect for another specified period.

6. The sound reproduction device as in claim 1, wherein the acoustic effect is a changing of sound image localization.

7. The sound reproduction device as in claim 1, wherein the acoustic effect is a changing of a frequency characteristic.

8. The sound reproduction device as in claim 1, wherein the acoustic effect is a changing of a reverberation characteristic.

9. A sound reproduction device comprising:

receiving means for receiving a radio wave including a sound signal;

reproducing means for reproducing a sound corresponding to the sound signal;

determining means for determining whether a degradation of the sound signal is more than a specified level;

adding means for adding an acoustic effect to the sound signal so that the sound reproduced by the reproducing means has the acoustic effect when the degradation of the sound signal is more than the specified level; and stopping means for stopping the acoustic effect for a specified period after the acoustic effect is added to the sound signal, even when the degradation of the sound signal is more than the specified level, wherein the stopping means automatically cancels the stopping of the acoustic effect after elapse of the specified period, when the degradation of the sound signal is more than the specified level after the specified period.

10. The sound reproduction device as in claim 9, wherein the acoustic effect allows all audible sound information included in the sound signal to be reproduced by the reproducing means.

11. The sound reproduction device as in claim 9, wherein the adding means changes a characteristic of the acoustic effect based on a level of the field strength.

12. The sound reproduction device as in claim 11, wherein the characteristic of the acoustic effect includes at least one of type, strength and duration of the acoustic effect.

13. The sound reproduction device as in claim 9, wherein the adding means continues to add the acoustic effect for another specified period.

14. The sound reproduction device as in claim 9, wherein the acoustic effect is a changing of sound image localization.

15. The sound reproduction device as in claim 9, wherein the acoustic effect is a changing of a frequency characteristic.

16. The sound reproduction device as in claim 9, wherein the acoustic effect is a changing of a reverberation characteristic.

17. A sound reproduction device comprising:

a receiving part configured to receive a radio wave including a sound signal;

a reproducing part configured to reproduce a sound corresponding to the sound signal;

a determining part configured to determine whether a field strength of the radio wave is less than a specified level;

an adding means configured to continuously add an acoustic effect to the sound signal for a first specified period so as to exert the acoustic effect to the sound, in response to a determination of the determining part that the field strength is less than the specified level; and a stopping part configured to automatically:

1) stop continuously the acoustic effect for a second specified period following the first specified period even when the field strength is less than the specified level; and 2) cancel the stopping after elapse of the second specified period so as to resume the acoustic effect when the determining part determines again that the field strength is less than the specified level after the second specified period.

18. A sound reproduction device comprising:

a receiving part configured to receive a radio wave including a sound signal;

a reproducing part configured to reproduce a sound corresponding to the sound signal;

a determining part configured to determine whether a degradation of the sound signal is more than a specified level;

an adding part configured to continuously add an acoustic effect to the sound signal for a first specified period so as to exert the acoustic effect to the sound in response to a determination of the determining part that the degradation of the sound signal is more than the specified level; and a stopping part configured to automatically:

1) stop continuously the acoustic effect for a second specified period after the first specified period even when the degradation is more than the specified level; and 2) cancel the stopping after elapse of the second specified period when the degradation is more than the specified level after the second specified period.

* * * * *